United States Patent
Sawada et al.

[11] Patent Number: 5,487,823
[45] Date of Patent: Jan. 30, 1996

[54] SPUTTERING TARGETS HAVING LIFE ALARM FUNCTION

[75] Inventors: Susumu Sawada, Tokyo; Junichi Anan, Kitaibaraki; Hiroki Nakamura; Yoshihiro Sakaya, both of Tokyo, all of Japan

[73] Assignee: Japan Energy Corporation, Tokyo, Japan

[21] Appl. No.: 233,171

[22] Filed: Apr. 26, 1994

[30] Foreign Application Priority Data

Apr. 28, 1993 [JP] Japan .................................. 5-125067

[51] Int. Cl.⁶ .......................... C23C 14/34; C23C 14/52
[52] U.S. Cl. ................. 204/298.12; 204/192.13; 204/298.03
[58] Field of Search .................. 204/192.13, 298.03, 204/298.12

[56] References Cited

U.S. PATENT DOCUMENTS

| | | | |
|---|---|---|---|
| 4,345,968 | 8/1982 | Coe | 156/627 |
| 4,374,722 | 2/1983 | Zega | 204/298.03 |
| 4,545,882 | 10/1985 | McKelvey | 204/192.13 |
| 5,380,419 | 1/1995 | Eggers et al. | 204/298.03 |

FOREIGN PATENT DOCUMENTS

| | | | |
|---|---|---|---|
| 3630737 | 11/1987 | Germany | 204/298.12 |
| 2199340 | 7/1988 | United Kingdom | 204/298.12 |

*Primary Examiner*—Aaron Weisstuch
*Attorney, Agent, or Firm*—Seidel Gonda Lavorgna & Monaco

[57] ABSTRACT

A sputtering target is provided in which a gas component source (material capable of evolving gas) is included in the bottom portion of the target. Predicting and determining the expiration of the useful life of sputtering targets is permitted more precisely and in a simpler way than heretofore described. Moreover over-sputtering is prevented with an improvement in target use efficiency.

7 Claims, 2 Drawing Sheets

PRIOR ART

SPUTTERING TARGETS HAVING LIFE ALARM FUNCTION

FIELD OF THE INVENTION

This invention relates to sputtering targets having a life-alarm function and which are capable of preventing over-sputtering positively and reliably while keeping target use efficiency high.

BACKGROUND OF THE INVENTION

The film-forming or film-depositing technology that utilizes the sputtering phenomenon caused by glow discharge under a reduced pressure in the presence of dilute gas is now used in a broad range of applications including technological devices and equipment, electronic devices and equipment, and ornaments or decorations. As regards the sputtering targets used in that technology, many proposals have been made, and various types of targets suited for the individual applications are in use.

Sputtering targets usually are disk-shaped, and sputtering is carried out with each sputtering target 1 bonded to a water-cooled backing plate 2 of copper, as shown in FIG. 4.

As sputtering is continued, the target is consumed with the lapse of time, as indicated in FIG. 5. When the point where erosion has progressed most severely reaches a location near the bottom of the target, the life of the target is deemed to have expired and the target is replaced by a new one.

If the time for replacing the sputtering target is too early, such a substantial part of the target is left unused that the target efficiency is poor. Conversely, if the time for replacement lags, the target efficiency is improved but erosive attack of the backing plate (over-sputtering) can take place. For the practice of sputtering, therefore, precise judgment of the sputtering target life has been a very important requirement to be considered.

Whether or not a sputtering target in service is nearing the end of its life can hardly be directly determined visually or otherwise. It has been customary to use, as a measure of sputtering target life, the integrated electric power value applied to the target, which value is closely related to the consumption of the target.

Specifically, with different types of sputtering targets the relations between their integrated electric power values and degrees of erosion are determined beforehand on the basis of actual past operation results. From these relations, the critical values of integrated electric power that cause over-sputtering are calculated. At the point where the integrated electric power value during sputtering with a given target has reached a preset value near its critical value, the target life is judged to have expired and the target is replaced by a new target.

However, this practice suffers from the problem that determining the optimum preset value is difficult.

As stated already, the integrated electric power value indicative of the time for replacement of a sputtering target has commonly been set in view of the relation between the integrated electric power value and the degree of erosion based upon past operation results. In reality, even target materials of the same kind often vary in density or in crystalline orientation and hence are eroded to varying degrees. Thus, strictly speaking, the relation between the integrated electric power value and the degree of erosion differs more or less between individual sputtering targets.

There are few steps that can be taken to overcome the low efficiency of some sputtering targets. Not infrequently, an over-sputtering accident has occurred. The generation of defective target products and damage to manufacturing equipment due to over-sputtering, of course, involves a very large loss.

OBJECT OF THE INVENTION

In view of the above, the present invention has for its object the establishment of means for predicting and determining the end of life of sputtering targets more precisely and in a simpler way than heretofore possible. Over-sputtering can be positively prevented and the target use efficiency is enhanced.

SUMMARY OF THE INVENTION

After intensive investigations made from various standpoints to attain the above object, the present inventors have now found the following. If a gas-component source (any material that evolves a gas component) is embedded in at least the bottom portion of a sputtering target at the location that is particularly susceptible to erosion, the gas source begins to produce a gas as the target erodes. As sputtering progresses, the remaining thickness of the target decreases and reaches the gas source. As a consequence, the partial pressure of the gas and the degree of vacuum in the sputtering chamber change rapidly enough to be detected, allowing the end of life of the sputtering target to be sensed precisely.

The present invention has been perfected on the basis of the above discovery. Thus, the present invention provides a sputtering target or a sputtering target bonded to a backing plate having a life alarm function characterized in that the target contains a gas-component source in the bottom portion thereof. The gas-component source may be selected from the group consisting of a hydride of a metal, an organic material, a container in which a compressed gas is sealed, a cavity in which air is present, and a cavity in which a gas not having an adverse effect upon the sputter film is sealed.

DESCRIPTION OF THE EMBODIMENTS

Figure 1:
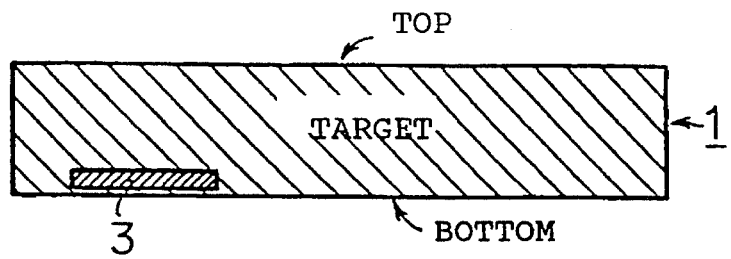
FIG. 1 is a diagrammatic sectional view illustrating a sputtering target embodying the present invention.

The present invention is principally characterized in that a sputtering target, as shown in FIG. 1, has a gas component source (element capable of evolving a gas-component) 3 built in the target's bottom portion, whereby the expiration of lifetime of the target can be precisely sensed so as to prevent over-sputtering or a drop in the target use efficiency.

The sputtering targets to which the present invention is applicable may be of varied types, including targets for VLSIs, magnetic and other applications. Needless to say, the materials are not specially restricted; the targets may be fabricated from any metal and its alloys such as Al, W, Mo, Ti, Ta, W—Ti alloy, Co—Ni alloy etc. and any silicide such as $MoSi_x$, $WSi_x$ etc.

The gas-component source (element capable of evolving a gas-component) is not particularly restricted either. For example, a hydride of a metal such as $TiH_2$ or $ZrH_2$ (in the form of powder, sintered body, etc.), organic material (anthraquinone, naphthacene, phenylalanine, etc.), container or ampul in which compressed gas is sealed, or the like is suitable. A hollow chamber or cavity in which air or a certain gas (hydrogen, krypton, etc.) that does not adversely affect the film formed by sputtering is confined and sealed may be used as a gas-component source.

The position in which a gas-component source is to be embedded or otherwise built or on the spattering target must be a bottom portion of the target at the depth where the gas evolution can be sensed at a time before over-sputtering has taken place and target use efficiency has not become poor. Preferably, the gas-component source is built into the target at any location in the target at a thickness range of about one millimeter from the bottom surface of the target.

While the gas-component source may be placed to occupy the entire bottom portion of a sputtering target, it is more efficient to dispose the source only in the limited region of the bottom portion where the erosion that progresses with sputtering is expected to reach the deepest.

An example of fabrication of the sputtering target according to the present invention will now be explained as typified by a target in which $TiH^2$ powder is chosen as a gas-component source.

Figure 2:
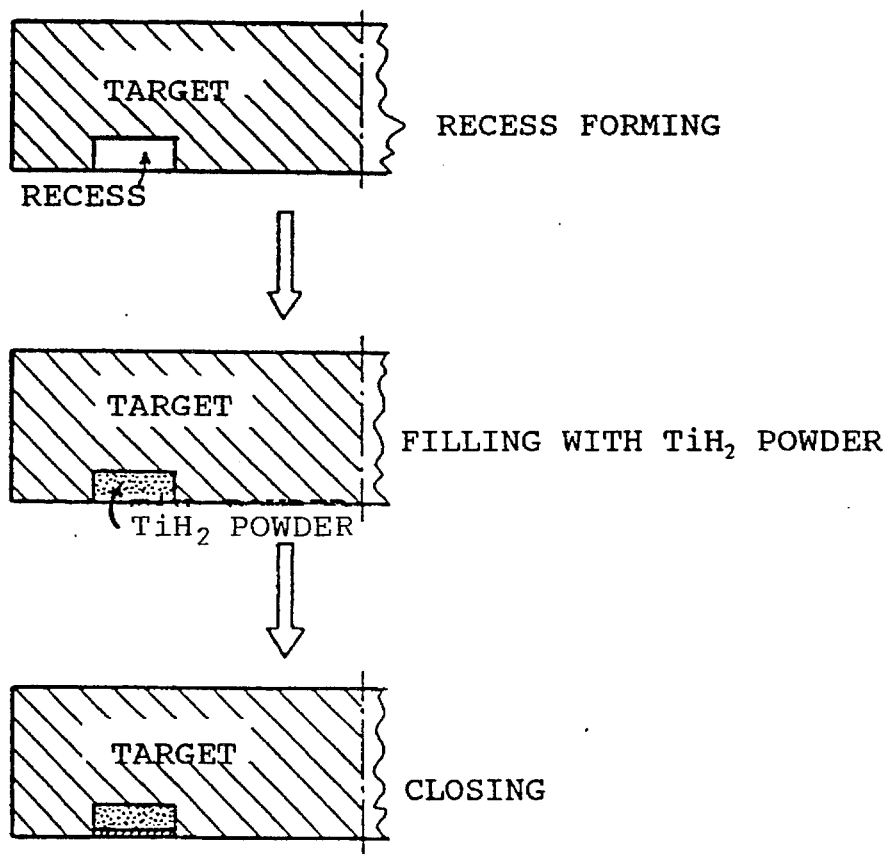
FIG. 2 is an explanatory view showing the sequential cross sections of a half of a target for explaining a procedure of fabricating a sputtering target of the present invention.

With the reference to FIG. 2, a recess is made in a suitable sputtering target by mechanical means or the like at the bottom of the region where the deepest erosion is expected to occur. The recess is filled with $TiH_2$ powder.

Next, the recess is closed by appropriate means. This completes the fabrication of a sputtering target using $TiH_2$ powder as a gas-component source in accordance with the present invention. To close the recess, pouring a metal or alloy of low melting point, preferably in, into the remaining space of the recess is recommended.

Figure 3:
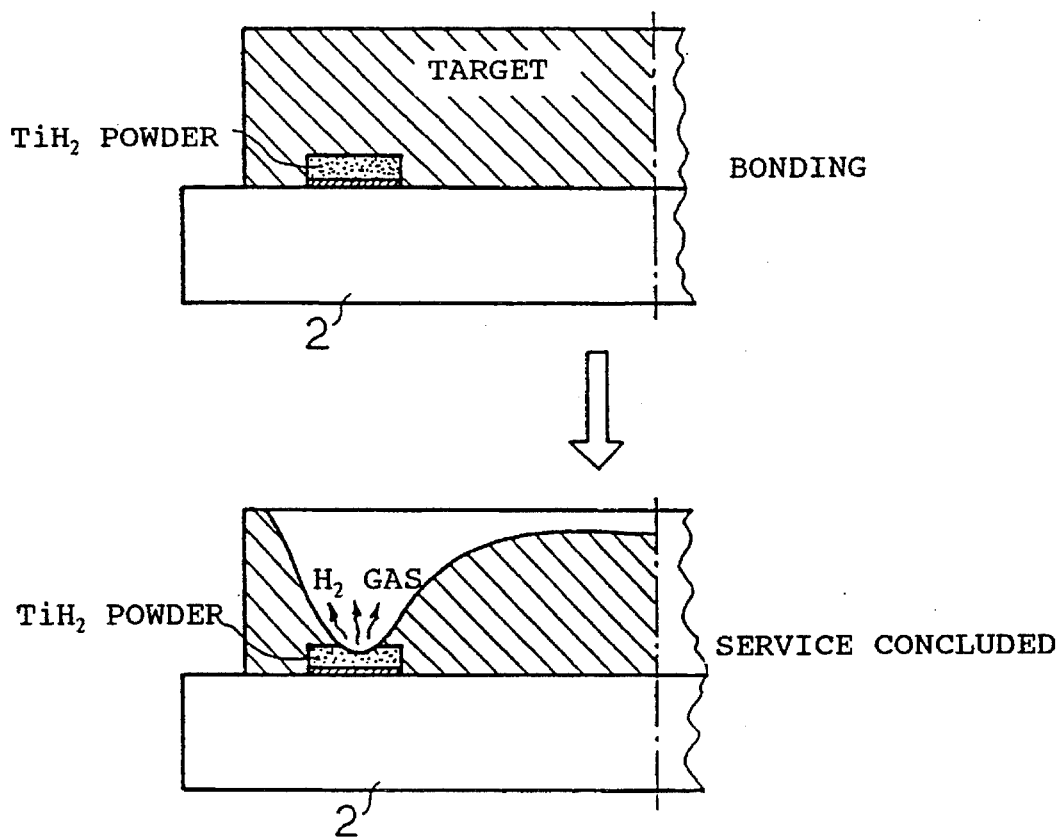
FIG. 3 is an explanatory view showing the cross sections of a half of a sputtering target of the present invention at the time of bonding to a backing plate and at the time of the end of life of the sputtering target.
Figure 4:
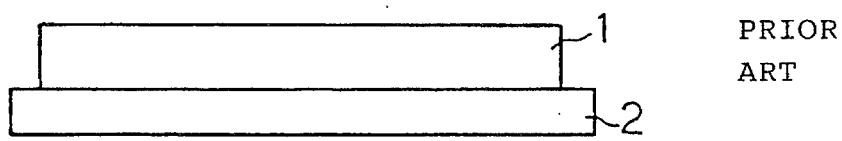
FIG. 4 is a front view of a sputtering target as bonded to a backing plate.
Figure 5:
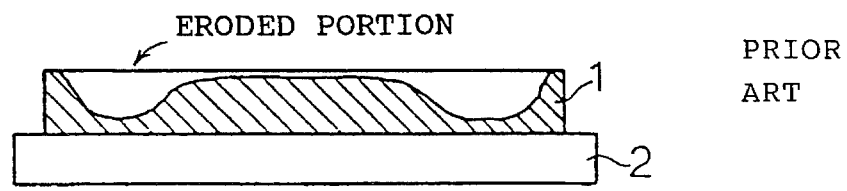
FIG. 5 is a sectional view explaining how a sputtering target is consumed.

Before the sputtering target is used in sputtering, it is bonded, as illustrated in FIG. 3, to a backing plate 2 in the usual manner.

As sputtering, proceeds erosion progresses until the $TiH_2$ embedded at the bottom of the target is reached. Then, the high temperature of the sputtering target causes a

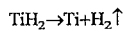

reaction with the result that $H_2$ gas is released into the sputtering chamber.

Detection of this $H_2$ gas partial pressure enables the operator to know that the life of sputtering target has expired. The end of target life can also be sensed by detecting the change in the degree of vacuum in the sputtering chamber with the release of $H_2$ gas.

In brief, the sputtering target with $TiH_2$ powder embedded in the bottom portion has a very desirable life alarm function.

Although the present invention has thus been described as incorporating $TiH_2$ powder as a gas-component source, similar effects are, of course, attainable with other metal hydrides, organic material, etc. as gas-component sources. Further, it should be quite obvious to those skilled in the art that embedding a container or ampul in which compressed gas is sealed or providing a cavity in which air is sealed is also equally effective.

EXAMPLE

The present invention is illustrated by the following example.

A pure Ti sputtering target in common use (292mm across and 10mm thick) was provided.

Next, as shown in FIG. 2, a recess 5mm in diameter and 1mm thick was formed at the bottom of the pure Ti sputtering target. The recess was filled with $TiH_2$ powder and closed with molten In.

Sputtering was performed using the sputtering target. Prior to the sputtering, the target was bonded to a backing plate of copper by a conventional bonding process. The backed target was then set in a sputtering chamber and was sputtering initiated.

As the sputtering with the target was continued, a quadrupole mass spectrometer (Q-MASS) that had been installed in the sputtering chamber detected a high concentration of $H_2$ gas. At that point the sputtering was concluded.

Following the conclusion of sputtering, the target was inspected. It was confirmed that the remaining thickness (below the level of the deepest erosion) of the target was 1mm, indicating that the target was consumed to attain a high material yield without any possibility of over-sputtering.

ADVANTAGES OF THE INVENTION

According to the present invention, as described above, a sputtering target is provided which permits more accurate prediction and determination of the expiration of the target life than heretofore. It ensures the prevention of over-sputtering during sputtering operation and enhances the target use efficiency. With these and other advantages, the invention brings very useful effects from the industrial viewpoint.

What we claim:

1. A sputtering target having a life alarm function comprising a sputtering target and a gas-component source embedded in a bottom portion of said target.

2. A sputtering target having a life alarm function comprising a backing plate, a sputtering target bonded to said backing plate and a gas-component source embedded in a bottom portion of said target.

3. A sputtering target according to claim 1 or 2 wherein the gas-component source is a hydride of a metal.

4. A sputtering target according to claim 1 or 2 wherein the gas-component source is an organic material.

5. A sputtering target according to claim 1 or 2 wherein the gas-component source is a container in which a compressed gas is sealed.

6. A sputtering target according to claim 1 or 2 wherein the gas-component source is a cavity in which air is present.

7. A sputtering target according to claim 1 or 2 wherein the gas-component source is a cavity in which a gas not having an adverse effect upon the sputtered film is sealed.

* * * * *

UNITED STATES PATENT AND TRADEMARK OFFICE
CERTIFICATE OF CORRECTION

PATENT NO. : 5,487,823
DATED : January 30, 1996
INVENTOR(S) : Susumu Sawada, et al It is certified that error appears in the above-indentified patent and that said Letters Patent is hereby corrected as shown below:

On the title page: Item

[73] Assignee: Japan Energy Corporation and Oki Electric Industry Co., Ltd., both of Tokyo, Japan Signed and Sealed this Fifteenth Day of October, 1996

Attest:

BRUCE LEHMAN

*Attesting Officer*    *Commissioner of Patents and Trademarks*